(12) United States Patent
Li et al.

(10) Patent No.: US 8,964,339 B2
(45) Date of Patent: Feb. 24, 2015

(54) FAULTY PROTECTIVE EARTH GROUND CIRCUIT DETECTION SYSTEM AND METHOD

(75) Inventors: Kang Li, Canton, MI (US); Alexander Shoshiev, Beverly Hills, MI (US)

(73) Assignee: Yazaki North America, Inc., Canton, MI (US)

( * ) Notice: Subject to any disclaimer, the term of this patent is extended or adjusted under 35 U.S.C. 154(b) by 349 days.

(21) Appl. No.: 13/435,289

(22) Filed: Mar. 30, 2012

(65) Prior Publication Data

US 2013/0258531 A1    Oct. 3, 2013

(51) Int. Cl.
*H02H 3/00* (2006.01)
*H02H 9/08* (2006.01)

(52) U.S. Cl.
USPC .......................................................... 361/42

(58) Field of Classification Search
CPC ................................ Y02T 10/12; Y02T 10/14
USPC .......................................................... 361/42
See application file for complete search history.

(56) References Cited

U.S. PATENT DOCUMENTS

| | | |
|---|---|---|
| 3,700,966 A | 10/1972 | Morrow |
| 3,737,726 A | 6/1973 | Tarchalski |
| 3,772,569 A | 11/1973 | Wible |
| 3,848,159 A | 11/1974 | Nye, Jr. et al. |
| 3,895,264 A | 7/1975 | Kirilloff |
| 4,375,660 A | 3/1983 | Tate et al. |
| 5,231,309 A | 7/1993 | Soma et al. |
| 5,956,218 A | 9/1999 | Berthold |
| 6,091,223 A * | 7/2000 | Rogers et al. ................. 320/111 |
| 6,104,161 A * | 8/2000 | Chung et al. .................. 320/109 |
| 6,621,677 B1 | 9/2003 | Amundsen |
| 6,891,350 B2 * | 5/2005 | George et al. ................. 320/105 |
| 6,988,061 B2 * | 1/2006 | Gray et al. ....................... 703/20 |
| 7,221,106 B1 * | 5/2007 | Nemir et al. ................... 315/291 |
| 8,173,938 B2 * | 5/2012 | Robst ............................. 219/488 |
| 2002/0024342 A1 * | 2/2002 | Bussinger ...................... 324/541 |
| 2004/0136125 A1 | 7/2004 | Nemir et al. |
| 2005/0024798 A1 | 2/2005 | Reynoso et al. |
| 2013/0190968 A1 * | 7/2013 | Nitzberg et al. ............. 701/31.6 |

FOREIGN PATENT DOCUMENTS

| | | |
|---|---|---|
| DE | 3315190 | 10/1984 |
| EP | 0252693 | 7/1987 |
| GB | 1018815 | 2/1966 |

* cited by examiner

*Primary Examiner* — Jared Fureman
*Assistant Examiner* — Lucy Thomas
(74) *Attorney, Agent, or Firm* — Harness, Dickey & Pierce, P.L.C.

(57) ABSTRACT

A system and method for detecting the presence of a voltage on a ground conductor which is coupled to a protective Earth (PE) terminal associated with a power source. The power source is used to apply a voltage to a device. The system may use a high impedance device coupled across a switch, with the switch being in communication with a portion of the device. A control system may monitor a voltage across the high impedance device and determine if the voltage across the high impedance device exceeds a predetermined threshold. Exceeding the predetermined threshold indicates that an unsafe voltage from the power source is present on the ground conductor. A natural high impedance path between the device and the Earth is used to provide an Earth connection through the device to the Earth during operation of the system.

13 Claims, 1 Drawing Sheet

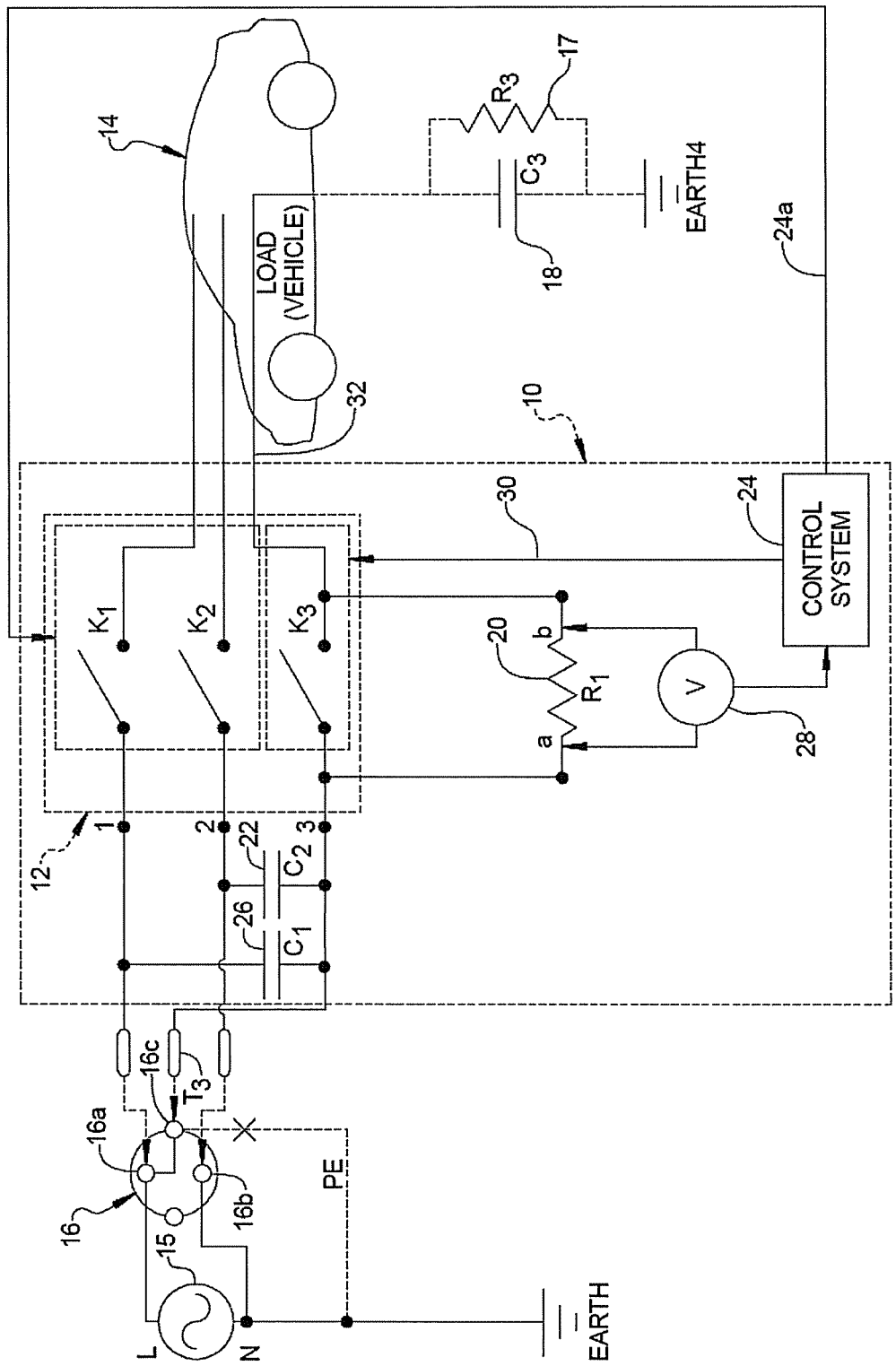

US 8,964,339 B2

FAULTY PROTECTIVE EARTH GROUND CIRCUIT DETECTION SYSTEM AND METHOD

FIELD

The present disclosure relates generally to Earth leakage circuit breakers, and more particularly to a system for detecting a fault in a Protective Earth (PE) fault without the need for a physical connection to the Earth as a reference point, and without the need to produce a tangible current flow in a component.

BACKGROUND

The statements in this section merely provide background information related to the present disclosure and may not constitute prior art.

Existing Earth Leakage Circuit Breaker (ECLB) systems are divided into two types: 1) voltage operated ELCB (vELCB) and 2) current operated ELCB (iELCB). As the name implies, a vELCB operates based on the electrical potential difference (voltage) between the monitored grounding terminal/metal part and a locally Earthed conductor. vELCB acts to break a circuit when the detected voltage reaches or goes beyond a predetermined limit. Because essentially no current is involved with a vELCB detection system, the major advantage of the vELCB is that the devices are able to detect a ground fault with a negligible leakage current. The biggest disadvantage for vELCB detection systems is the necessity of having a functional Earth connection. By "functional Earth connection" it is meant a conductor that is physically connected to Earth.

The second major type of ELCB detection system, an iECLB system, is often referred to in North America as "Ground Fault Circuit Interrupter" (GFCI) system. An iELCB operates by measuring the sum of current flowing into and out of an electrical device. In normal operation this sum will be zero, which means there is no current leakage in the system. Put differently, the current flowing into a device is equal to the current flowing out of the device. An iELCB detection system operates by detecting when the magnitude of current flowing into some device on a hot line of an AC power source becomes different from the current flowing on the neutral line of the power source (i.e., the sum of current flowing into and out becomes "non-zero"). When this non-zero current reaches a predetermined upper limit, then an iELCB detection system trips a breaker to interrupt current flow to the component or device. A principal advantage of an iELCB detection system is that no real Earth connection is required. However, a principal drawback, at least in some industries and/applications, is that there needs to be some tangible level of current flow to component or device that is coupled to the AC power source, in order to be able to detect if there exists a predetermined magnitude of difference in the current flowing to the device and the current leaving the device.

One specific application where an ELCB system is required is in connection with Electric Vehicle Supply Equipment (EVSE) used to recharge the batteries of an electric vehicle. Safety standards associated with EVSE equipment require that such equipment must continually monitor a protective Earth (PE) connection and interrupt the power to the electric vehicle if a PE connection fails. Two specific International Electrotechnical Commission (IEC) standards require that the power outlet PE terminal (i.e., receiving power from an AC power source) shall not be connected with the vehicle PE terminal until the power outlet PE grounding is verified. But with an electric vehicle, the vehicle itself does not present a direct, conductive ground path to the Earth (i.e., a PE connection). And still, IEC standards do not allow power to be coupled to the vehicle until a proper PE connection is verified, so an iELCB detection system cannot be used because no tangible current flow is permitted to be passed to the vehicle with first verifying the PE connection.

SUMMARY

In one aspect the present disclosure relates to a system for detecting the presence of a voltage on a ground conductor which is coupled to a protective Earth (PE) terminal associated with a power source. The power source is used to apply a voltage to a device. The system may include a high impedance device, for example a resistor, coupled across a switch, with the switch being in communication with a portion of the device. A control system may be included for monitoring a voltage across the high impedance device and determining if the voltage across the high impedance device exceeds a predetermined threshold. Exceeding the predetermined threshold indicates that an unsafe voltage from the power source is present on the ground conductor. A natural high impedance path between the Earth and the device is used to provide an Earth connection through the device during operation of the system.

In another aspect the present disclosure relates to a system for detecting the presence of a voltage on a ground conductor which is coupled to a protective Earth (PE) terminal associated with an AC power source. The AC power source may be used to apply a charging voltage to a switch system of a charger associated with an electric vehicle. The system may include a high impedance device coupled across a switch of the switch system, with the switch being in communication with a chassis of the vehicle. A control system may be included for monitoring a voltage across the high impedance device and determining if the voltage across the high impedance device exceeds a predetermined threshold. Such an instance indicates that an unsafe voltage from the AC power source is present on the ground conductor. A natural high impedance path between the Earth and the vehicle's chassis is used to provide an Earth connection through the vehicle's chassis during operation of the system. The control system may control opening and closing of the switch system in response to the sensed voltage across the high impedance device.

In still another aspect a method is disclosed for detecting the presence of a voltage on a ground conductor which is coupled to a protective Earth (PE) terminal associated with a power source, and where the power source is being used to apply a voltage to a device. The method may include using a natural high impedance path including at least one of capacitance and resistance between the device and the Earth, to form a connection with the Earth. The method may also include sensing a voltage across a high impedance device coupled across a switch while the switch is open, with the switch being in communication with the PE connection between the device and the Earth. A control system may be used which is in communication with the high impedance device. The control system may operate to determine when a voltage across the high impedance device indicates the presence of an unsafe voltage from the power source being present on the ground conductor.

Further areas of applicability will become apparent from the description provided herein. It should be understood that the description and specific examples are intended for purposes of illustration only and are not intended to limit the scope of the present disclosure.

BRIEF DESCRIPTION OF THE DRAWING

The drawing described herein is for illustration purposes only and are not intended to limit the scope of the present disclosure in any way.

FIG. 1 is a high level schematic diagram of one example of a ELCB detection system in accordance with one embodiment of the present disclosure.

DETAILED DESCRIPTION

The following description is merely exemplary in nature and is not intended to limit the present disclosure, application, or uses. It should be understood that throughout the drawings, corresponding reference numerals indicate like or corresponding parts and features.

Referring to FIG. 1, one embodiment of an ELCB detection system 10 is shown in accordance with the present disclosure. In this example the system 10 is coupled to a switching system 12 of an Electric Vehicle Supply Equipment ("EVSE") component. The switching system 12 is used to apply a Protective Earth connection to load 14. The load 14 in this example is an electric vehicle, and will hereinafter be referred to as "vehicle 14". An AC power source 15 supplies electric power to the vehicle 14 through a suitable connection wall socket 16 having a PE ground terminal 16c, a first phase terminal 16a and a neutral or second phase terminal 16b. A switch K3 of switching system 12 is used by the vehicle charger circuit (not specifically shown) to couple the PE ground terminal 16c to the vehicle 14. The vehicle 14 effectively has a natural capacitance and resistance, represented by capacitor symbol 18 (C3) and resistor symbol 17 (R3), between it and the Earth. It will be appreciated, however, that no separate physical electrical conductor is used to make a direct connection between any portion of the vehicle 14 and the Earth.

An important recognition that helps to form a basis of operation for the system 10 is that, while no separate physical component (i.e., conductive cable) is coupling the vehicle 14 to the Earth, the natural capacitance and resistance of the vehicle 14, relative to the Earth (i.e., the natural capacitive/resistive path between the vehicle and the Earth), can function as the Earth connection for the circuit. Because the impedance between the vehicle and the Earth is high, essentially only an intangible leakage current flow is produced in the vehicle 14 (such as through its chassis) when the system 10 is checking for a proper PE connection.

With continued reference to FIG. 1, the PE ground terminal 16c of the connection wall socket 16 is normally connected to Earth, and thus forms a proper PE connection. However, if this PE connection is faulty, such as through a defective terminal 16c, or possibly because of mis-wiring, and voltage from the terminal 16a or the terminal 16b is present at reference point T3, then the possibility exists for the chassis of the vehicle 14 to receive all or a portion of the AC line voltage. This condition can also be difficult for a traditional iELCB detection system to detect because none of the three inputs (i.e., first phase, neutral/second phase or PE ground line) can be assumed to be a safe reference point with respect to the Earth potential.

In any electric circuit, there may always be a point that can be considered as a reference point. In the circuit of FIG. 1, the point labeled "T3" may be considered as the reference point, or in other words the point in the circuit that the potential of all other points are measured against.

To continually sense and monitor whether point T3 is at Earth potential, the system 10 may make use of a high resistance resistor 20 (R1), which may have a resistance of typically at least about two megaohms, a voltage measuring device 28, and a control system 24. For Electromagnetic Compatibility (EMC) purposes, the system 10 may include two Y-capacitors 26 (C1) and 22 (C2). A control system 24 is responsive to an output of a voltage measuring device 28. The resistor 20 (R1) is coupled across switch K3 of the switching system 12, which places point "a" of the resistor effectively at point T3. The control system 24 may be used to control switches K1/K2 via a control signal 24a and switch K3 via a control output signal on signal line 30 so that no one of switches K1-K3 is closed until the system 10 verifies that a PE connection at point T3 exists. Also, the control system 10 may operate to generate a signal that directly or indirectly acts to open the switches K1/K2 and K3, for example by signals on signal line 30 and 24a, if a faulty PE connection at T3 is detected at any time during a normal charging cycle. It will also be appreciated while the voltage measuring device 28 has been shown as a separate component in FIG. 1, that the voltage detection across the resistor 20 (R1) may be performed within the control system 24 by an integral voltage measuring subsystem of the control system. However, for the purpose of helping to describe the operation of the system 10, the voltage measuring device 28 has been shown in FIG. 1 as an independent component.

In normal operation the control system 24 must first verify that a PE connection exists at point T3 before closing the switches K1/K2 and K3 respectively. Put differently, this means that T3 must be at Earth potential. If a PE fault is detected, switches K1-K3 will not be closed.

First consider the situation where a PE fault exists, and when the connection plug 16 is connected to the terminal associated with the AC power source 15, that point T3 is not at Earth potential. This may occur if PE (Protective Earth) line has been inadvertently mis-wired so that point T3 is receiving at least some tangible quantity of AC line voltage. In this instance the voltage present at T3 (relative to the Earth potential) may be viewed as the "Vin" (voltage input) to the system 10. The impedance between T3 and the Earth will be high, meaning essentially that only an intangible leakage current will flow into the vehicle 14 chassis along line 32 through resistor 20 (R1), and to the Earth ground by way of the natural capacitance/resistance of the vehicle 14.

During the operation with switch K3 open, resistor 20 (R1) forms one leg of a voltage divider and the other leg is formed by the vehicle's capacitance 18 (C3) and resistance 17 (R3). The voltage across resistor 20 (R1) can be denoted as "VR1" and the natural capacitance 18 (C3) and resistance 17 (R3) of the vehicle 14 provides a substitute for the Earth connection. The voltage VR1 across resistor 20 (R1) will thus be a function of Vin. VR1 may be represented by the following formula:

$$VR1 = Vin*(R1/(R1+ZC3\|R3))$$

where ZC3 is the impedance of C3 at the AC frequency, and "ZC3∥R3" means ZC3 in parallel with R3.

The voltage across resistor 20 (R1) will be detected by the voltage measuring device 28, which in one embodiment may be a voltmeter, and analyzed by control system 24. If this voltage is above the predetermined first limit, then the control system 24 determines that a faulty PE connection exists and switches K1-K3 will not be closed. If the detected voltage is less than the predetermined second value, then the control system 24 concludes that the PE connection is intact and closes switches K1/K2 and K3 accordingly.

If the wall socket 16 PE ground terminal 16C becomes floating (i.e., has no connection to any one of the first phase, second phase or the Earth), then the point T3 will be half of the voltage between the first phase and the neutral/second phase lines due to the exists of the Y-capacitors 26 (C1) and 22 (C2). As described above, T3 is not the same potential at the Earth potential. The potential difference between T3 and the Earth creates a voltage across resistor 20 (R1), which is higher than the first predetermined limit, from which the control system 24 determines that a faulty PE connection exists. As a result, the control system 24 will not close switches K1-K3.

If point T3 is close enough to the Earth potential, then the voltage across resistor 20 (R1) will not exceed the predetermined second limit discussed above. In this case, the control system 24 considers that the PE is good and closes switches K1/K2 and K3 accordingly.

The system 10 thus does not require a separate physical connection (i.e., an electrical conductor) to be used to couple the vehicle's 14 chassis to Earth in order to have the needed functional Earth connection between the vehicle and the Earth, such as with vELCB detectors. As a further advantage, the system 10 does not require that an appreciable current be flowing into the vehicle's chassis in order to perform its voltage sensing operation, such as with iELCB detectors. This arrangement meets the requirements of present day standards for checking/monitoring an AC source connection to a vehicle when using a charging system associated with the vehicle. The system 10 provides the advantage of a traditional iELCB detector (no physical PE connection required) with the advantage of a vELCB (no current flow required to flow to the end device).

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A system for detecting the presence of a voltage on a ground conductor which is coupled to a protective Earth (PE) terminal associated with a power source, where the power source is being used to apply a source voltage via first and second terminals to a device, the system including:
   a high impedance device coupled across a switch, with the switch being in communication with a portion of the device and with the PE terminal associated with the power source;
   a control system for opening and closing the switch, the control system being adapted to open the switch before applying the source voltage across the first and second terminals, and to monitor a voltage across the high impedance device and determine if the voltage across the high impedance device exceeds a predetermined threshold, thereby indicating that an unsafe voltage from the power source is present on the ground conductor before the source voltage has been applied to the device; and
   where a natural high impedance path between the Earth and the device is used to provide an Earth connection through the device during operation of the system.

2. The system of claim 1, further including a voltage measuring device which detects the voltage across the high impedance device.

3. The system of claim 1, wherein the control system prevents closing of the switch if the voltage across the high impedance device is detected to be above the predetermined threshold.

4. The system of claim 1, wherein the high impedance device and an impedance of the natural high impedance path from the device to the Earth form a voltage divider arrangement.

5. A system for detecting the presence of a voltage on a ground conductor which is coupled to a protective Earth (PE) terminal associated with an alternating current (AC) power source, where the AC power source is being used to apply a charging voltage to a switch system of a charger associated with an electric vehicle, the system including:
   a high impedance device coupled across a switch of the switch system, with the switch being in communication with a chassis of the vehicle and with the PE terminal of the AC power source;
   a control system for monitoring a voltage across the high impedance device and determining if the voltage across the high impedance device exceeds a predetermined threshold while the AC power source is applying a charging voltage to the electric vehicle, thereby indicating that an unsafe voltage from the AC power source is present on the ground conductor;
   the control system further configured to open the switch of the switch system before power from the AC power source is applied to the electric vehicle, to detect if a voltage is present across the high impedance device, which indicates that power from the AC power source is present on the PE terminal; and
   where a natural high impedance path between the Earth and the vehicle's chassis is used to provide an Earth connection through the vehicle's chassis during operation of the system and while detecting for a voltage across the high impedance device while no power is being applied to the electric vehicle by the charger.

6. The system of claim 5, further comprising a voltage measuring device which detects the voltage across the high impedance device.

7. The system of claim 5, wherein an impedance of the natural high impedance path from the vehicle's chassis to the Earth, and the high impedance device, together form a voltage divider circuit.

8. A method for detecting the presence of a voltage on a ground conductor which is coupled to a protective Earth (PE) terminal associated with a power source, where the power source is being used to apply a voltage to a device, the method including:
   using a natural high impedance path including at least one of capacitance and resistance, between the device and the Earth, to form a connection with the Earth;
   sensing a voltage across a high impedance device coupled across a switch of a switch system while the switch is open, with a first side of the switch being in communication with the PE terminal and a second side of the switch being in communication with the Earth through the device and the natural high impedance path between the device and the Earth; and
   using a control system in communication with the high impedance device to open the switch before power from the power source is used to apply a voltage to the device, to determine the presence of a voltage across the high impedance device before applying power to the device, and further using the control system to monitor for a fault with the PE terminal while power is being provided through the switch system to the device.

9. The method of claim 8, wherein said sensing a voltage comprises using a means for measuring the voltage across the high impedance device.

10. The method of claim 9, further comprising determining when the voltage across the high impedance device exceeds a predetermined threshold, thereby indicating that an unsafe voltage from the power source is present on the ground conductor.

11. The method of claim 8, wherein the device comprises an electric vehicle.

12. The method of claim 8, further comprising using the control system to maintain the switch in an open condition until the control system verifies that no unsafe voltage from the power source is present on the ground conductor, and then using the control system to close the switch.

13. The method of claim 12, further comprising using the control system to control additional switches of the switch system in communication with a first phase line of the power source and a second phase line of the power source, wherein the second phase line comprises a neutral line, and wherein the power source comprises an AC power source with the first phase line and the second phase lines are used to communicate power from the AC power source to the device.

* * * * *